(12) United States Patent
Lee et al.

(10) Patent No.: US 7,760,318 B2
(45) Date of Patent: Jul. 20, 2010

(54) METHOD OF MANUFACTURING ARRAY SUBSTRATE FOR LIQUID CRYSTAL DISPLAY DEVICE WITH GATE PAD TERMINAL ACTING AS ETCHING MASK

(75) Inventors: Kyoung-Mook Lee, Seou (KR);
Nack-Bong Choi, Gyeonggi-do (KR);
Seung-Hee Nam, Gyeonggi-do (KR);
Jae-Young Oh, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 11/255,869

(22) Filed: Oct. 24, 2005

(65) Prior Publication Data
US 2006/0038956 A1    Feb. 23, 2006

Related U.S. Application Data

(62) Division of application No. 10/654,488, filed on Sep. 4, 2003, now Pat. No. 6,972,820.

(30) Foreign Application Priority Data

Dec. 31, 2002    (KR) ...................... 10-2002-0088084

(51) Int. Cl.
*G02F 1/1345* (2006.01)
*G09G 3/36* (2006.01)

(52) U.S. Cl. ...................... 349/152; 349/149; 349/151; 345/104

(58) Field of Classification Search .............. 349/42, 349/139, 149, 151, 152; 345/104
See application file for complete search history.

(56) References Cited

U.S. PATENT DOCUMENTS 4,960,719 A * 10/1990 Tanaka et al. ............... 438/158
5,930,607 A    7/1999 Satou
6,151,091 A    11/2000 Muramatsu (Continued)

FOREIGN PATENT DOCUMENTS

| JP | 360097632 | 5/1985 |
|---|---|---|
| JP | 07-318975 A | 12/1995 |
| KR | 10-1999-0075407 A | 10/1999 |
| KR | 10-2000-0047013 A | 7/2000 |
| KR | 10-2002-0083249 A | 11/2002 |

*Primary Examiner*—Hoan C Nguyen
(74) *Attorney, Agent, or Firm*—Birch, Stewart, Kolasch & Birch LLP

(57) ABSTRACT

A method of manufacturing an array substrate for a liquid crystal display device includes forming a gate electrode, a gate line, and a gate pad on a substrate, forming a gate insulating layer on the gate electrode, the gate line, and the gate pad, forming an active layer on the gate insulating layer, forming an ohmic contact layer on the active layer, forming source and drain electrodes, a data line and a data pad on the ohmic contact layer, forming a pixel electrode, forming a gate pad terminal on the gate insulating layer, forming a data pad terminal covering the data pad, forming a passivation layer on the pixel electrode, the gate pad terminal and the data pad terminal, exposing the gate pad terminal and the gate pad by etching the passivation layer and the gate insulating layer, and exposing the data pad terminal by etching the passivation layer.

6 Claims, 15 Drawing Sheets

U.S. PATENT DOCUMENTS

| | | | |
|---|---|---|---|
| 6,337,520 B1 * | 1/2002 | Jeong et al. | 257/763 |
| 6,521,912 B1 * | 2/2003 | Sakama et al. | 257/57 |
| 6,683,669 B1 * | 1/2004 | Fujikawa | 349/149 |
| 2002/0063253 A1 * | 5/2002 | Hong et al. | 257/59 |
| 2002/0109799 A1 * | 8/2002 | Choi et al. | 349/43 |
| 2003/0197187 A1 * | 10/2003 | Kim et al. | 257/83 |

* cited by examiner

METHOD OF MANUFACTURING ARRAY SUBSTRATE FOR LIQUID CRYSTAL DISPLAY DEVICE WITH GATE PAD TERMINAL ACTING AS ETCHING MASK

The present application is a Divisional of application Ser. No. 10/654,488 filed on Sep. 4, 2003, now U.S. Pat. No. 6,972,820 which claims the priority benefit of Korean Patent Application No. 2002-88084, filed in Korea on Dec. 31, 2002. The entire contents of each of these applications are hereby incorporated by reference.

BACKGROUND OF THE INVENTION

1. Field of the Invention

The present invention relates to a liquid crystal display (LCD) device and more particularly, to an array substrate for a liquid crystal display device and a manufacturing method thereof.

2. Discussion of the Related Art

Generally, a liquid crystal display (LCD) device includes two substrates that are spaced apart and face each other with a liquid crystal material layer interposed between the two substrates. Each of the substrates includes electrodes that face each other, wherein a voltage applied to each electrode induces an electric field between the electrodes and within the liquid crystal material layer. Alignment of liquid crystal molecules of the liquid crystal material layer is changed by varying the intensity or direction of the applied electric field. Accordingly, the LCD device displays an image by varying light transmissivity through the liquid crystal material layer in accordance with the arrangement of the liquid crystal molecules.

FIG. 1 is a cross sectional view of an array substrate for a liquid crystal display (LCD) device according to related art. In FIG. 1, a gate electrode 12, a gate line 14, and a gate pad 16 are formed on a transparent insulating substrate 10. The gate electrode 12 is elongated from the gate line 14, and the gate pad is located at an end portion of the gate line 14.

On the gate electrode 12, the gate line 14, and the gate pad 16 is formed a gate insulating layer 20, on which over the gate electrode 12, an active layer 22 and an ohmic contact layer 24 are sequentially formed.

On the ohmic contact layer 24 source and drain electrodes 32 and 34 are formed, and on the gate insulating layer 20 a data pad 36 having the same material as the source and drain electrodes 32 and 34 is formed. Though not shown in FIG. 1, on the gate insulating layer 20, a data line connected to the source electrode 32 and the data pad 36 is formed. The source and drain electrodes 32 and 34 form a thin film transistor T with the gate electrode 12.

Next, the source and drain electrodes 32 and 34, and the data pad 36 are covered by a passivation layer 40 that has first, second, and third contact hole for exposing the drain electrode 34, the gate pad 16, and the data pad 36, respectively.

Next, on the passivation layer 40, a transparent conductive material is deposited and patterned to form a pixel electrode 52, a gate pad terminal 54, and a data pad terminal 56. The pixel electrode 52 is connected to the drain electrode via the first contact hole 42, and a portion of the pixel electrode 52 overlaps with the gate line 14. The gate pad terminal 54 and the data pad terminal 56 are connected to the gate pad 16 and the data pad 36 via the second and the third contact holes 44 and 46, respectively.

The array substrate as explained above is manufactured by photolithographic processes using 5 masks, and the photolithographic process includes cleaning, deposition of the photoresist layer, exposure to light, development, etching, and so on. Therefore, if one photolithographic process step can be eliminated in the manufacturing of the array substrate, the manufacturing time and the cost can be reduced.

SUMMARY OF THE INVENTION

Accordingly, the present invention is directed to a manufacturing method of an array substrate for a liquid crystal display device that substantially obviates one or more problems due to limitations and disadvantages of the related art.

An advantage of the present invention is to provide a method of manufacturing an array substrate for a liquid crystal display device that shortens manufacturing time and cost.

Additional features and advantages of the present invention will be set forth in the description which follows, and in part will be apparent from the description, or may be learned by the practice of the invention. The objectives and other advantages of the present invention will be realized and attained by the structure particularly pointed out in the written description and claims hereof as well as the appended drawings.

To achieve these and other advantages and in accordance with the purpose of the present invention, as embodied and broadly described, a method of manufacturing an array substrate for a liquid crystal display device includes forming a gate electrode, a gate line and a gate pad on a substrate, attaching a first KAPTON tape on the gate pad, forming a gate insulating layer on the substrate having the first KAPTON tape, forming an active layer on the gate insulating layer over the gate electrode, forming an ohmic contact layer on the active layer, forming source and drain electrodes, a data line, and a data pad, forming a pixel electrode connected to the drain electrode, forming a data pad terminal covering the data pad, attaching a second KAPTON tape on the data pad terminal, forming a passivation layer on the substrate having the second KAPTON tape, and detaching the first and the second KAPTON tapes to expose the gate pad terminal and the data pad terminal. The step of forming the active layer and the step of forming source and drain electrodes, the data line and the data pad can be processed through one photolithographic process. At this time, the photolithographic process may use a diffraction exposure technique. The step of forming the data pad terminal and the step of forming the pixel electrode can be carried out at the same time.

In another aspect, a manufacturing method of an array substrate for a liquid crystal display device includes forming a gate electrode, a gate line, and a gate pad on a substrate, disposing a first metal mask on the gate pad, forming a gate insulating layer, an amorphous silicon layer, a doped silicon layer, and a metal layer on the substrate after disposing the first mask, removing the first metal mask, patterning the metal layer, the doped silicon layer, and the amorphous silicon layer using a diffraction exposure technique to form source and drain electrodes, a data line, a data pad, an ohmic contact layer, and an active layer, forming a pixel electrode contacting the drain electrode, forming a gate pad terminal and a data pad terminal covering the gate pad and the data pad, respectively, disposing second and third metal masks on the gate pad and data pad terminals, respectively, forming a passivation layer on the substrate after disposing the second and third masks, and removing the second and the third masks. The step of forming the gate pad terminal and the data pad terminal may be carried out simultaneously with the step of forming the pixel electrode.

In another aspect, a manufacturing method of an array substrate for a liquid crystal display device includes forming a gate electrode, a gate line, and a gate pad on a substrate, forming a gate insulating layer on the gate electrode, the gate line, and the gate pad, forming an active layer on the gate insulating layer over the gate electrode, forming an ohmic contact layer on the active layer, forming source and drain electrodes, a data line and a data pad on the ohmic contact layer, forming a pixel electrode contacting the drain electrode, forming a gate pad terminal on the gate insulating layer such that a portion of the gate insulating layer is open over the gate pad, forming a data pad terminal covering the data pad, forming a passivation layer on the pixel electrode, the gate pad terminal and the data pad terminal, exposing the gate pad terminal and the gate pad by etching the passivation layer and the gate insulating layer, and exposing the data pad terminal by etching the passivation layer. The gate insulating layer and the passivation layer may contain silicon nitride or silicon oxide. The etchant for etching the passivation layer may include hydrogen fluoride (HF).

In another aspect, a method of manufacturing an array substrate for a liquid crystal display device includes forming a gate electrode, a gate line, and a gate pad on a substrate by sequentially depositing a metal layer and a transparent conductive layer and patterning, forming a gate insulating layer on the gate electrode, the gate line, and the gate pad, forming an active layer on the gate insulating layer over the gate electrode, forming an ohmic contact layer on the active layer, forming source and drain electrodes, a data line and a data pad on the ohmic contact layer, forming a pixel electrode contacting the drain electrode, forming a data pad terminal covering the data pad, forming a passivation layer on the pixel electrode and the data pad terminal, exposing the gate pad by etching the passivation layer and the gate insulating layer, and exposing the data pad terminal by etching the passivation layer. The transparent conductive layer may be one of indium-tin-oxide (ITO) and indium-zinc-oxide (IZO). The step of forming the active layer and the step of forming source and drain electrodes, the data line and the data pad can be processed through one photolithographic process. At this time, the photolithographic process may use a diffraction exposure technique. The insulating layer and the passivation layer contain silicon nitride or silicon oxide. The etchant for etching the passivation layer includes hydrogen fluoride (HF). The step of forming the gate pad terminal and the data pad terminal is carried out simultaneously with the step of forming the pixel electrode.

It is to be understood that both the foregoing general description and the following detailed description are exemplary and explanatory and are intended to provide further explanation of the present invention as claimed.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Reference will now be made in detail to the illustrated embodiments of the present invention, which are illustrated in the accompanying drawings.

Figure 1:
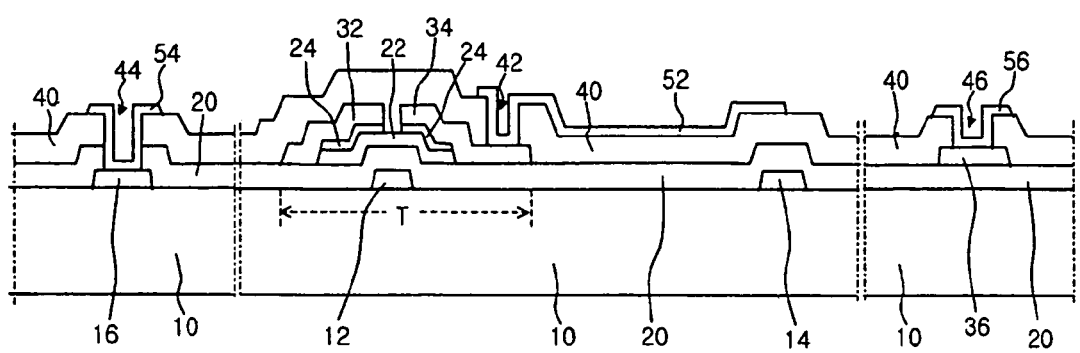
FIG. 1 is a cross sectional view of an array substrate for an LCD device according to the related art.
Figure 2A:
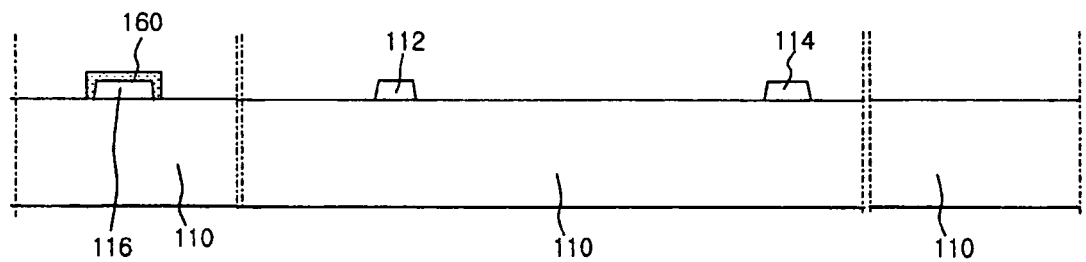
FIGS. 2A to 2F are cross sectional views of a manufacturing method of the array substrate according to a first embodiment of the present invention.

FIGS. 2A to 2F show a manufacturing process of an array substrate for a liquid crystal display (LCD) device according to the first embodiment of the present invention. As shown in FIG. 2A, a gate electrode 112, a gate line 114 and a gate pad 116 are formed by depositing and patterning a metal layer on a substrate 110 using a first mask. The gate line 114 elongates in one direction, the gate electrode 112 is connected to the gate line 114, and the gate pad 116 is located at one end of the gate line 114. On the gate pad 116, a first KAPTON tape 160 is attached.

Figure 2B:
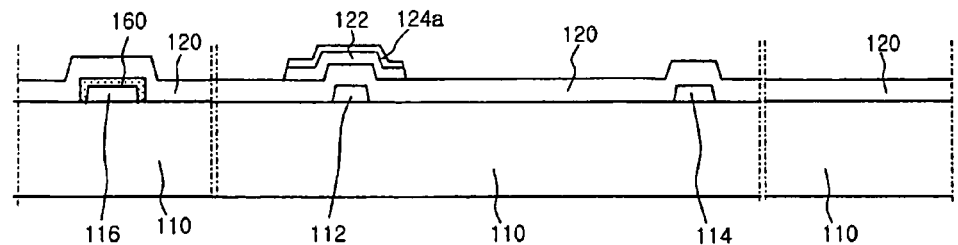

Next, as shown in FIG. 2B, a gate insulating layer 120, amorphous silicon layer, a doped silicon layer are sequentially deposited, and patterned into an active layer 122 and a doped semiconductor layer 124a using a second mask. The gate insulating layer 120 contains silicon nitride or silicon oxide.

Figure 2C:
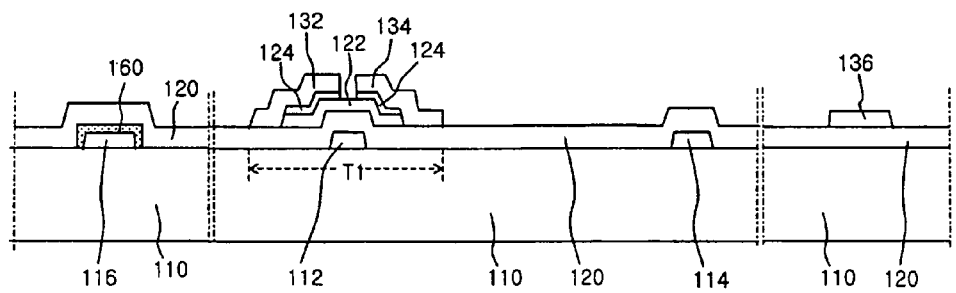

Next, as shown in FIG. 2C, a metal layer is deposited and patterned using a third mask to form source and drain electrodes 132 and 134, and a data pad 136. A portion of the doped semiconductor layer 124a of FIG. 2B between the source and drain electrodes is etched to form an ohmic contact layer 124. The source and drain electrodes 132 and 134 constitute a thin film transistor T with the gate electrode 112. Though not shown, a data line is formed at this step. The data line is connected to the source electrode 132 and has the data pad 136 at one end.

Figure 2D:
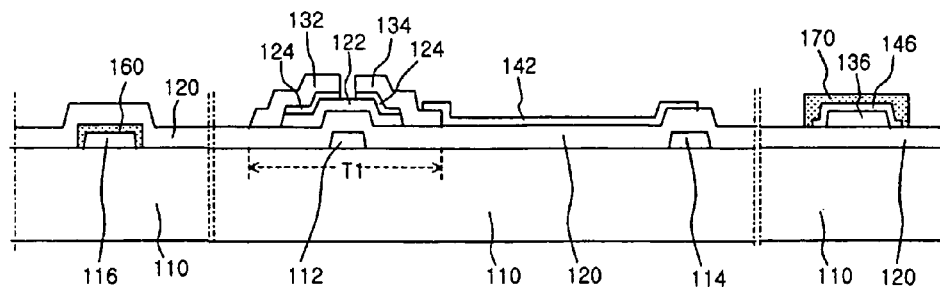

Next, as shown in FIG. 2D, a transparent conductive material is deposited and patterned using a photolithographic method and a fourth mask to form a pixel electrode 142 and a data pad terminal 146. The pixel electrode 142 is connected to the drain electrode 134 and the data pad terminal 146 covers the data pad 136. Sequentially, a second KAPTON tape 170 is attached on the data pad terminal 146 to cover the data pad terminal 146.

Figure 2E:
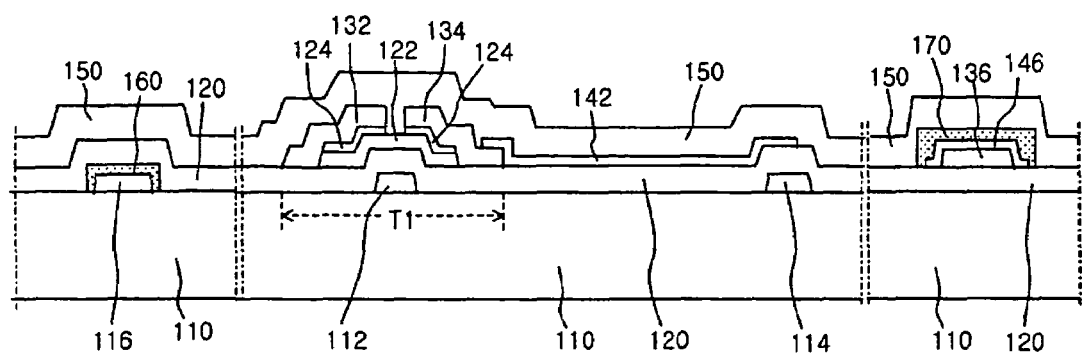

Next, as shown in FIG. 2E, a passivation layer 150 of silicon nitride or silicon oxide is formed to cover the substrate 110 having the second KAPTON tape 170.

Figure 3:
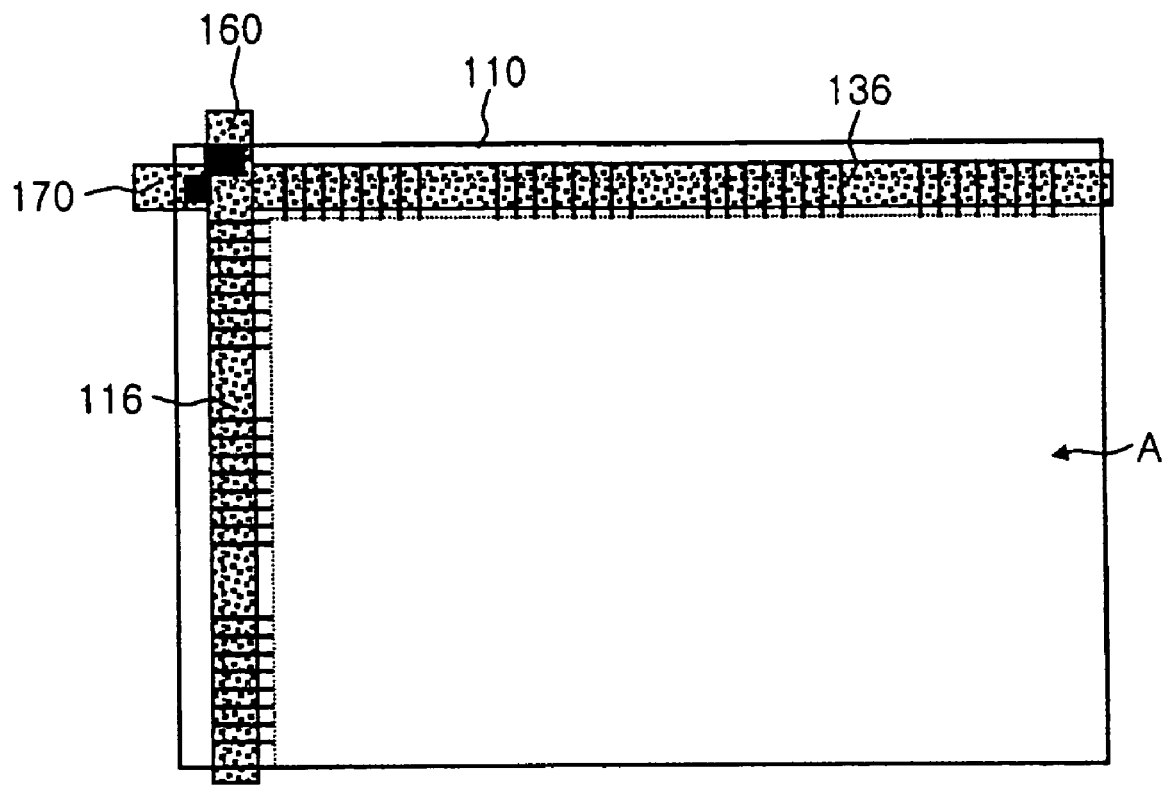
FIG. 3 is a schematic plan view of the array substrate according to the first embodiment of the present invention.

The array substrate having the first and second KAPTON tapes 160 and 170 is shown in FIG. 3, which is a schematic plan view at this step. As shown, a display region A having a plurality of thin film transistors and the pixel electrodes is defined on the substrate 110, and outside of the display region A the gate pad 116 and the data pad 136 are formed, on which the first and second KAPTON tapes 160 and 170 are attached, respectively.

Figure 2F:
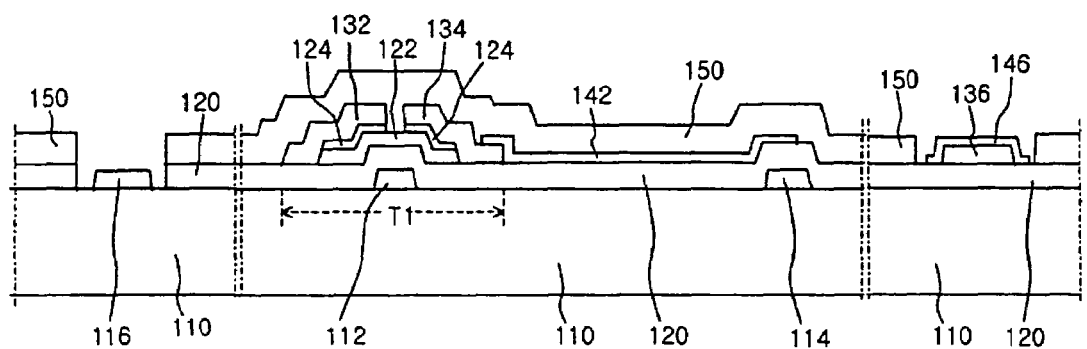

Next, as shown in FIG. 2F, the first and second KAPTON tapes 160 and 170 (FIG. 2E) are detached such that the gate insulating layer 120 and the passivation layer 150 over the first KAPTON tape 160 (FIG. 2E), and the passivation layer 150 over the second KAPTON tape 170 are removed, respectively. Therefore, the gate pad 116 and the data pad terminal 146 are exposed.

As explained above, in this embodiment, by using the KAPTON tapes, the pads can be exposed and thus, the array substrate can be manufactured by using four masks.

Figure 4:
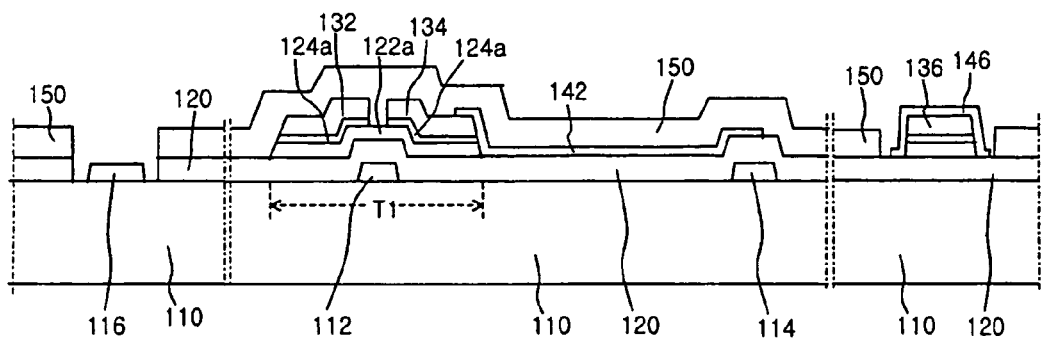
FIG. 4 is a cross sectional view of the array substrate according to the first embodiment of the present invention.

In the meantime, by using the diffraction exposure technique the source and drain electrodes and the active layer can be formed in one photolithographic process, and in this case, the manufacturing processes is further decreased. The array substrate manufactured using the diffraction technique is shown in FIG. 4. The active layer 122a has the same shape as the source and drain electrodes 132 and 134 except for a portion disposed between the source and drain electrodes 132 and 134. The ohmic contact layer 124a has the same shape as the source and drain electrodes 132 and 134. The amorphous silicon layer and the doped silicon layer are also under the data pad 136.

If a metal mask is used, the pad can be exposed, which is shown in FIGS. 5A to 5G. In this second embodiment, the source and drain electrodes and the active layer are formed in one photolithographic process using the diffraction exposure technique.

Figure 5A:
FIGS. 5A to 5G are cross sectional views of a manufacturing method of the array substrate according to a second embodiment of the invention.

As shown in FIG. 5A, a metallic material is deposited on the transparent substrate 210 and patterned by using a first mask to form a gate electrode 212, a gate line 214, and a gate pad 216. The gate line 214 is elongated in one direction and has the gate electrode 212 and the gate pad 216 as in first embodiment.

Figure 5B:
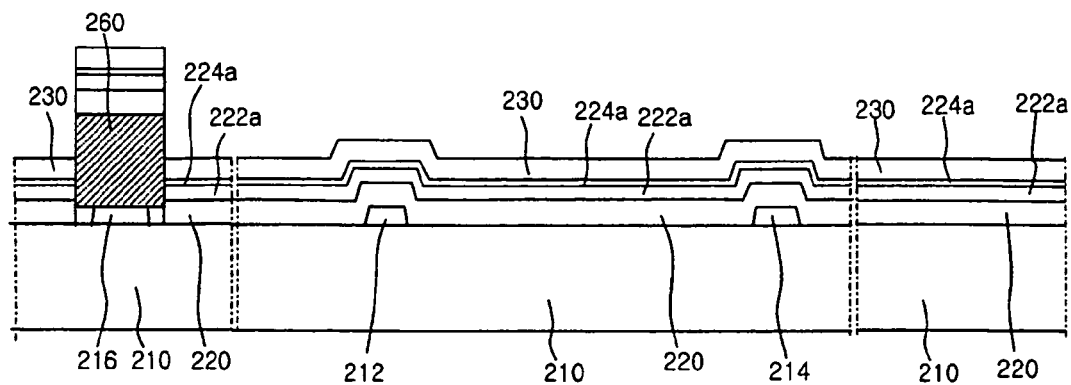

Next, as shown in FIG. 5B, a first metal mask is disposed on the gate pad 216 and a gate insulating layer 220, an amorphous silicon layer 222a, a doped silicon layer 224a, and a metal layer 230 are sequentially formed. At this time, the gate insulating layer 220, the amorphous silicon layer 222a, the doped silicon layer 224a, and the metal layer 230 are formed on the first metal mask 260. The gate insulating layer 220 contains silicon nitride or silicon oxide.

Figure 5C:
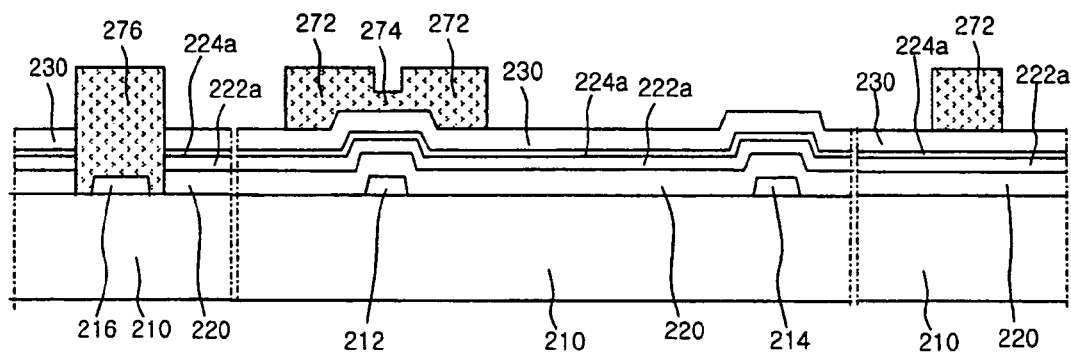

Next, as shown in FIG. 5C, after removing the first metal mask 260 (FIG. 5B), a photoresist layer is deposited, exposed to light, and patterned to form photoresist patterns 272, 274 and 276. At this point, the first photoresist pattern 272 having a first thickness is formed where source and drain electrodes and a data pad will be formed. The second photoresist pattern 274 having a second thickness is positioned where a channel between the source and drain electrodes will be formed. The second thickness is smaller than the first thickness. The third photoresist pattern 276 covers the gate pad 216.

Figure 5D:
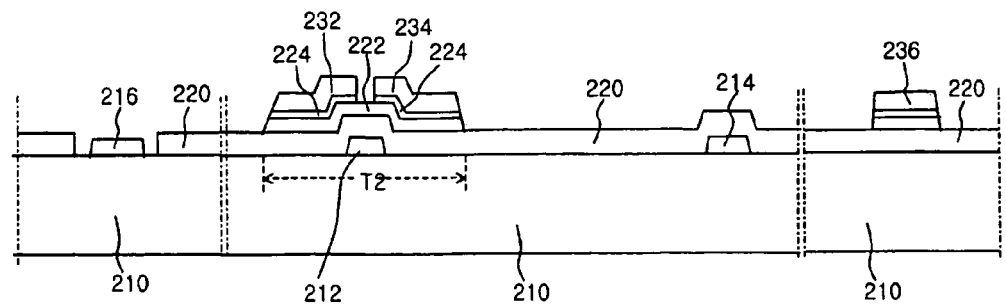

Next, as shown in FIG. 5D, by using the photoresist patterns 272, 274 and 276, source and drain electrodes 232 and 234, a data pad 236, an ohmic contact layer 224, and an active layer 222 are formed and the photoresist patterns 272, 274 and 276 are removed. At this time, the ohmic contact layer 224 has the same shape as the source and drain electrodes 232 and 234, and the active layer 222 has the same shape as the source and drain electrodes 232 and 234 except a portion between the source and drain electrodes 232 and 234. The source and drain electrodes 232 and 234 constitutes a thin film transistor T2 with the gate electrode 212. Though not shown, a data line is formed at this step. The data line is connected to the source electrode 232 and has the data pad 236 at one end. Under the data line the amorphous silicon layer and the doped silicon layer are left.

Figure 5E:
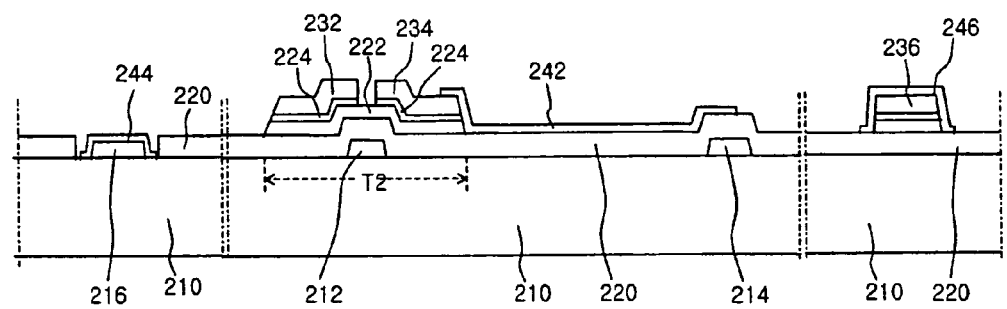

Next, as shown in FIG. 5E, a transparent conductive material is deposited and patterned to form a pixel electrode 242, a gate pad terminal 244, and the data pad terminal 246 using a third mask. The pixel electrode 242 is connected to the drain electrode 234, the gate pad terminal 244 and the data pad terminal 246 and covers the gate pad 216 and data pad 246, respectively. The transparent conductive material can be indium-tin-oxide (ITO) or indium-zinc-oxide (IZO).

Figure 5F:
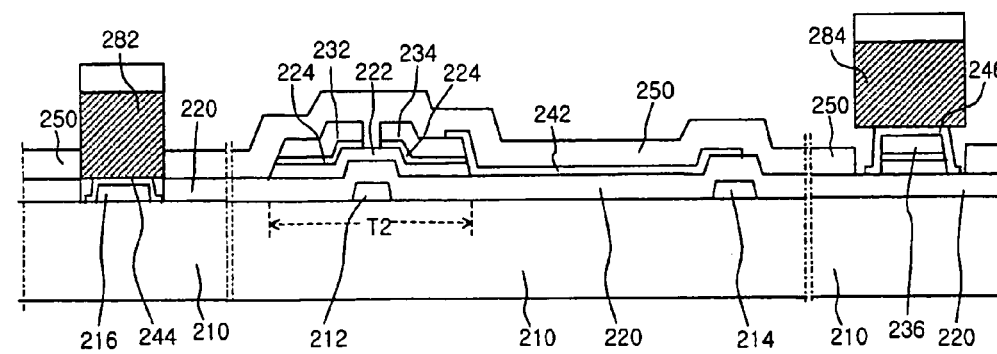

Next, as shown in FIG. 5F, on the gate pad terminal 244 and on the data pad terminal 246, second and third metal masks 282 and 284 are positioned and then, the passivation layer 250 is deposited entirely. The passivation layer 250 is also positioned on the second and third metal masks 282 and 284.

Figure 5G:
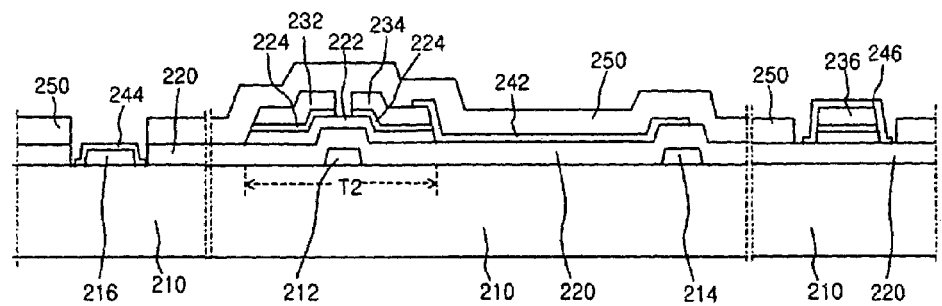

Next, as shown in FIG. 5G, the gate pad terminal 244 and the data pad terminal 246 are exposed by removing the second and the third metal masks 282 and 284.

Therefore, the gate pad terminal and the data pad terminal can be exposed without any further photolithographic process to achieve low manufacturing cost and shorten the manufacturing time. As a modification of this second embodiment, the source and drain electrodes, and the active layer can be formed by separate photolithographic processes.

Figure 6:
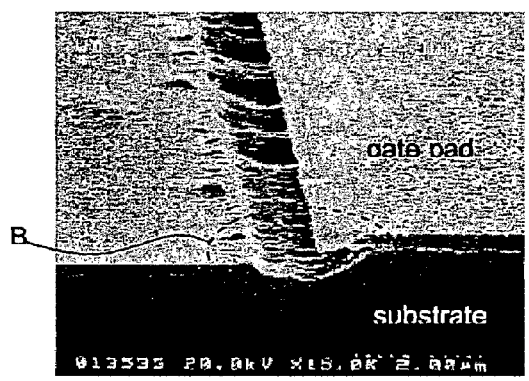
FIG. 6 is a photo illustrating the gate pad portion of the invention.

In the meantime, after the completed array substrate is combined with a color filter substrate, the pads can be exposed by dipping the pad portion into the etchant for silicon nitride or silicon oxide, thereby reducing the process. The gate pad formed by this method is shown in FIG. 6 which is a photo produced by a scanning electron microscope. The exposed pad has an undercut portion B where the substrate under the gate pad is also etched. Therefore in attaching a PCB, the gate pad can separate.

The third embodiment of the present invention is directed to solving this problem and is illustrated in FIGS. 7A to 7E and FIG. 8.

Figure 7A:
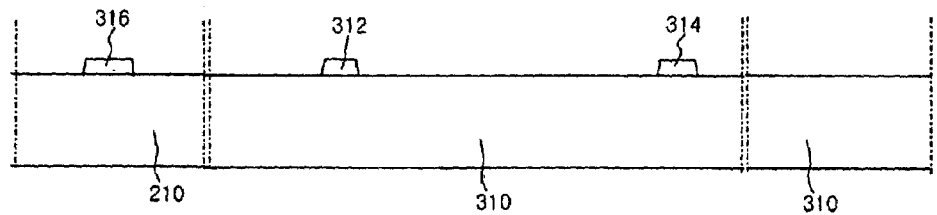
FIGS. 7A to 7E are cross sectional views of a manufacturing method of the array substrate according to a third embodiment of the present invention.

As shown in FIG. 7A, a gate electrode 312, a gate line 314 and a gate pad 316 are formed on a substrate 310 using a first mask.

Figure 7B:
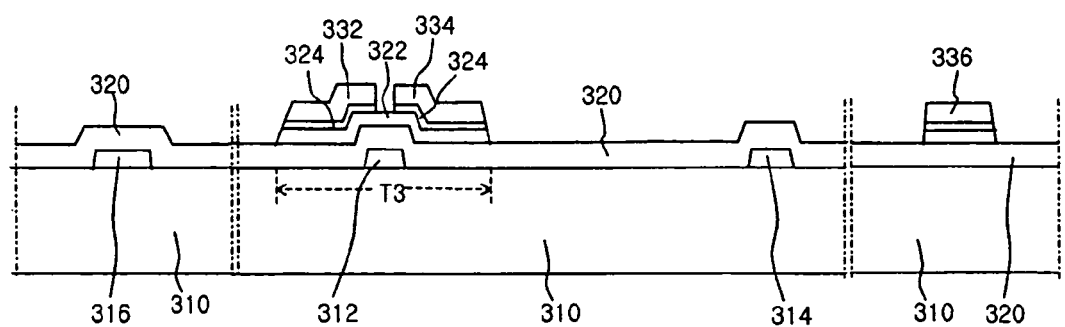

Next, as shown in FIG. 7B, a gate insulating layer 320, an amorphous silicon layer, a doped silicon layer, and a metal layer are sequentially deposited, and patterned using a second mask for a diffraction exposure technique to form source and drain electrodes 332 334, a data pad 336, an ohmic contact layer 324, and an active layer 322 through one photolithographic process. At this time, the ohmic contact layer 324 has the same shape as the source and drain electrodes 332 and 334, and the active layer 322 has the same shape as the source and drain electrodes 332 and 334 except the portion between the source and drain electrodes 332 and 334. The source and drain electrodes 332 and 334 constitutes a thin film transistor T3 with the gate electrode 312. Though not shown, a data line is formed at this step. The data line is connected to the source electrode 332 and has the data pad 336 at one end. Under the data pad 336, the amorphous silicon layer and the doped silicon layer are left.

Figure 7C:
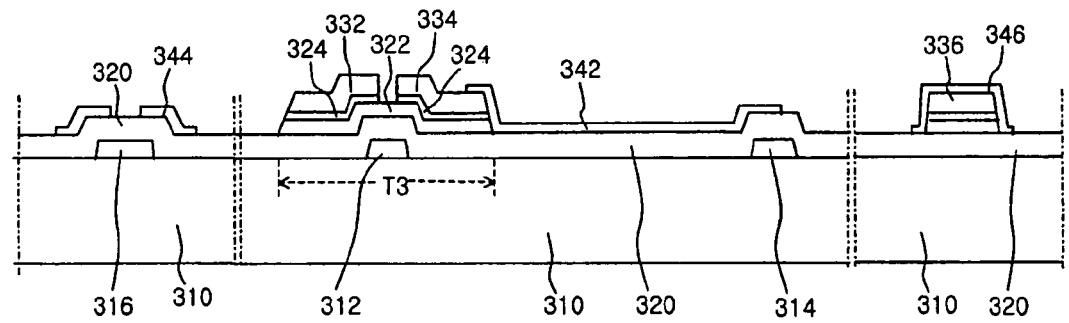

Next, as shown in FIG. 7C, a transparent conductive material is deposited and patterned to form a pixel electrode 342, a gate pad terminal 344, and the data pad terminal 346 using a third mask. The pixel electrode 342 is connected to the drain electrode 334, the gate pad terminal 344 and the data pad terminal 346 and covers the gate pad 316 and data pad 346, respectively. At this point, a portion of the gate insulating layer 320 on the gate pad is open by the gate pad terminal 344. The transparent conductive material can be indium-tin-oxide (ITO) or indium-zinc-oxide (IZO).

Figure 7D:
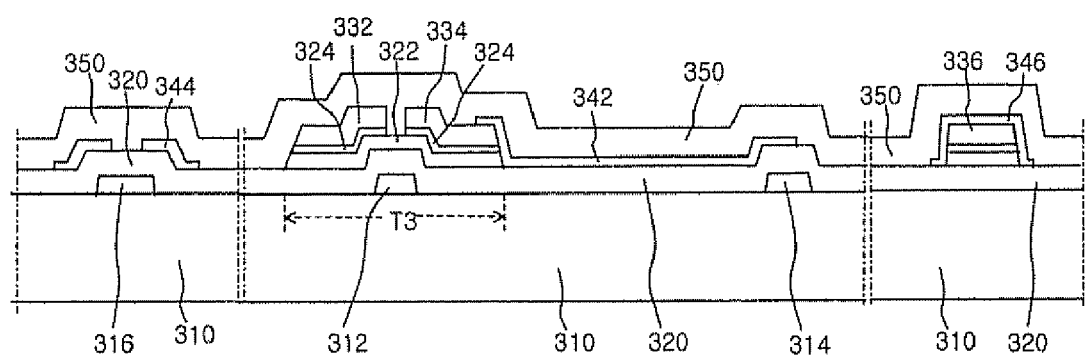
Figure 7D:
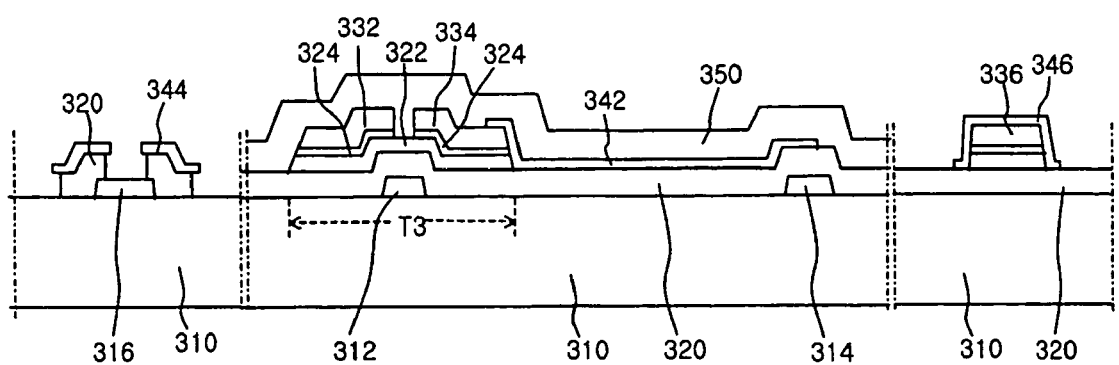

Next, as shown in FIG. 7D, a passivation layer of silicon nitride or silicon oxide is formed.

Figure 7E:
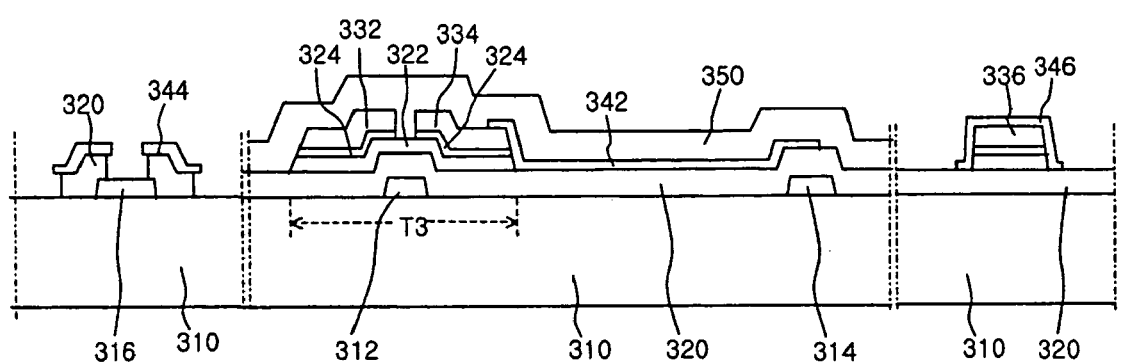
Figure 8:
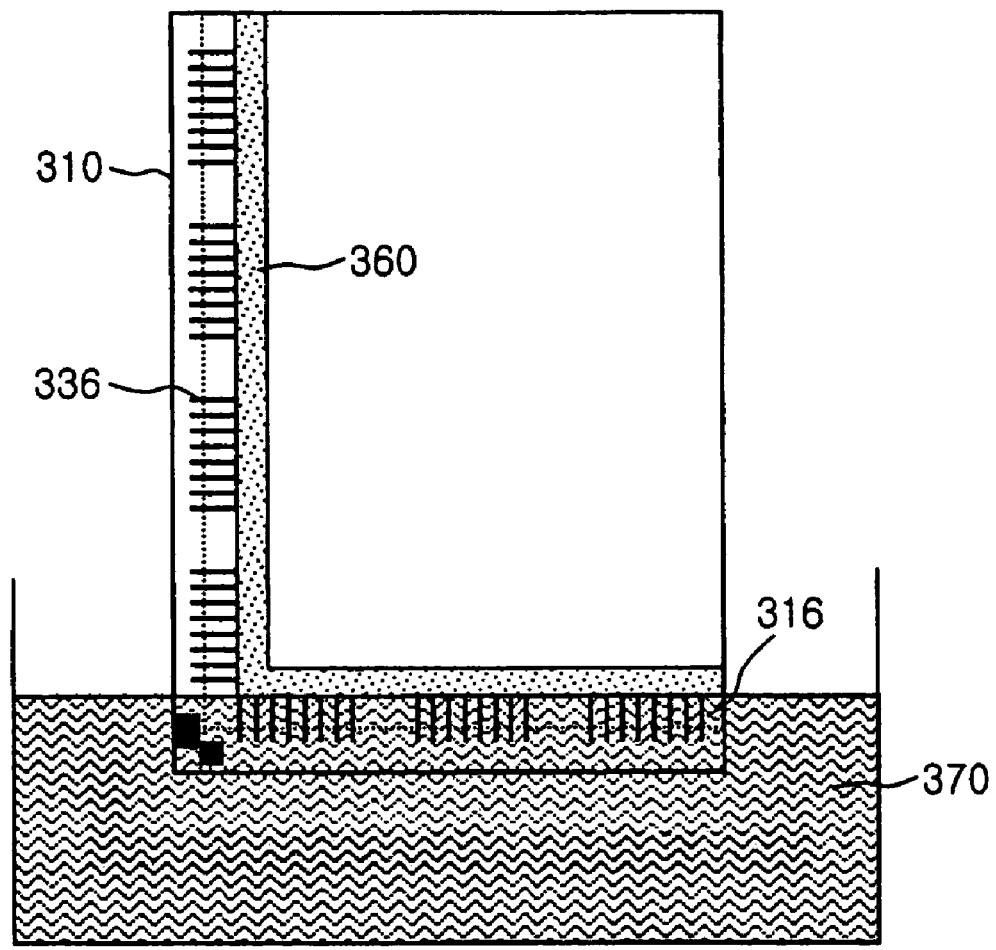
FIG. 8 shows a schematic plan view of the array substrate according to the third embodiment of the present invention.

Next, as shown in FIGS. 7E and 8, the gate pad portion and the data pad portion are dipped into etchant 370 to expose the gate pad terminal 344, the gate pad 316, and the data pad terminal 346. At this time, a portion of the passivation layer 350 in the data pad portion is removed, whereas in the gate pad portion not only the passivation layer 350 but also the gate insulating layer 320 uncovered by the gate pad terminal 344 is removed to expose the gate pad 316. At this point a portion of the gate insulating layer 320 beneath the gate pad terminal 344 can be over etched. The etchant or etching solution is for etching silicon nitride or silicon oxide layers and may include hydrogen fluoride (HF).

This step can be carried out after forming the passivation layer 350 or after combining the array substrate and the color filter substrate. The reference numeral 360 in FIG. 8 indicates a seal pattern between the two substrates.

In the third embodiment, since the gate pad terminal 344 of a transparent conductive material covers the gate pad 316 and the side portion of the gate pad 316 is not exposed, in attaching the PCB, the gate pad 316 will not separate.

In this way, damage to the gate pad can be prevented by adopting a double layer structure composed of a metal layer and a transparent conductive layer. The fourth embodiment shows this structure.

Figure 9A:
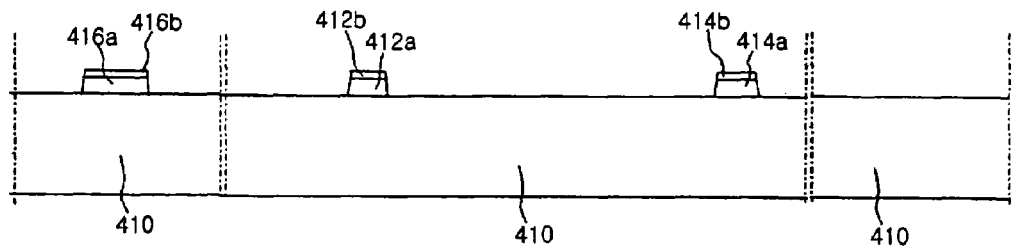
FIGS. 9A to 9E are cross sectional views of a manufacturing method of the array substrate according to a fourth embodiment of the present invention.

First, as shown in FIG. 9A, a metallic material and a transparent conductive material is sequentially deposited on the substrate 410 and patterned using a first mask to form a gate electrode 412a and 412b, a gate line 414a and 414b, and a gate pad 416a and 416b that have a double structure. The transparent conductive material can be indum-tin-oxide.

Figure 9B:
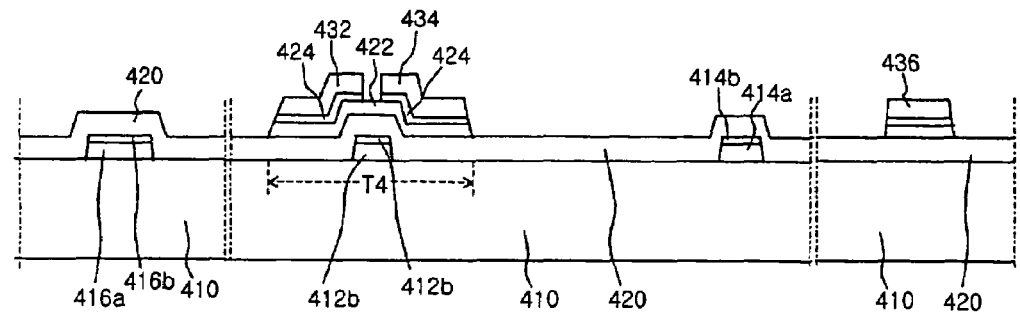

Next, as shown in FIG. 9B, a gate insulating layer 420, an amorphous silicon layer, a doped silicon layer, and a metal layer are sequentially deposited, and patterned using a second mask for a diffraction exposure technique to form source and drain electrodes 432 434, a data pad 436, an ohmic contact layer 424, and an active layer 422 through one photolithographic process. At this time, the ohmic contact layer 424 has the same shape as the source and drain electrodes 432 and 434, and the active layer 422 has the same shape as the source and drain electrodes 432 and 434 except a portion between the source and drain electrodes 432 and 434. The source and drain electrodes 432 and 434 constitutes a thin film transistor T4 with the gate electrode 412a and 412b. Though not shown, a data line is formed in this step. The data line is connected to the source electrode 432 and has the data pad 436 at one end. Under the data pad 436, the amorphous silicon layer and the doped silicon layer are left.

Figure 9C:
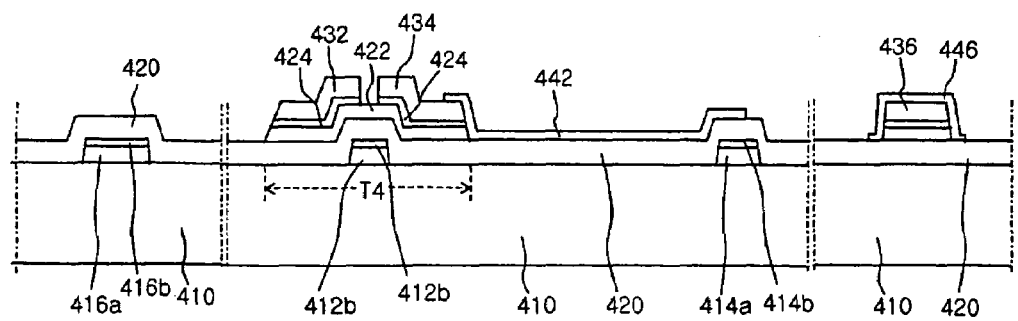

Next, as shown in FIG. 9C, a transparent conductive material is deposited and patterned to form a pixel electrode 442 and a data pad terminal 446 using a third mask. The pixel electrode 442 is connected to the drain electrode 434, and the data pad terminal 446 covers the data pad 436. The transparent conductive material can be indium-tin-oxide (ITO) or indium-zinc-oxide (IZO).

Figure 9D:
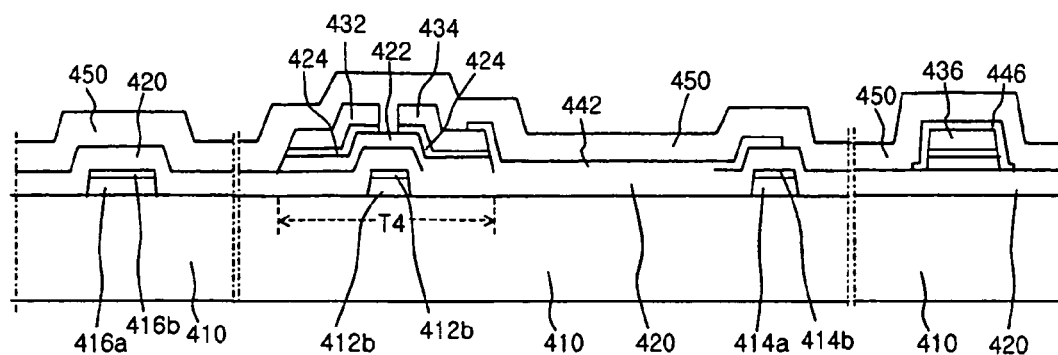

Next, as shown in FIG. 9D, a passivation layer 450 of silicon nitride or silicon oxide is formed over the entire composite.

Figure 9E:
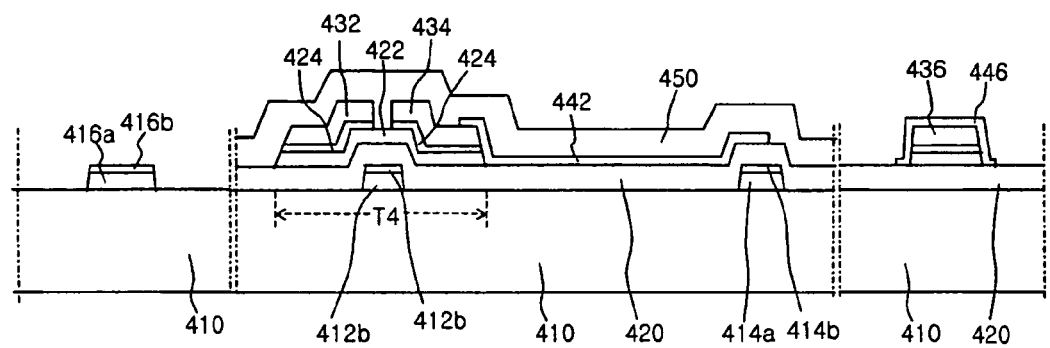
Figure 10:
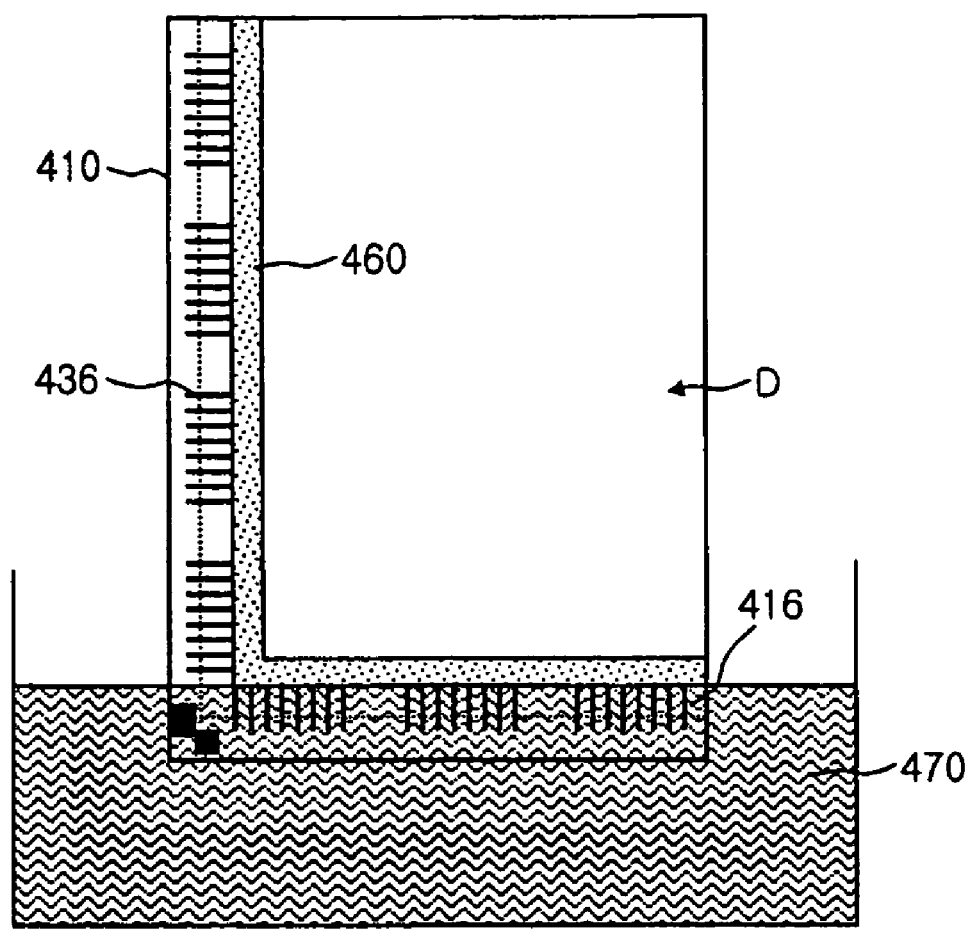
FIG. 10 shows an etching process according to the fourth embodiment of the present invention.

Next, as shown in FIGS. 9E and 10, the gate pad portion and the data pad portion are dipped into etchant 470 to expose the gate pad 416a and 416b, and the data pad terminal 446. At this time, a portion of the passivation layer 450 in the data pad portion is removed, whereas in the gate pad portion not only the passivation 450 but also the gate insulating layer 420 is removed to expose the gate pad 416a and 416b. The etchant or etching solution is used for etching silicon nitride or silicon oxide layers and may include hydrogen fluoride (HF).

This step can be carried out after forming the passivation layer 450 or after combining the array substrate and the color filter substrate. The reference numeral 460 in FIG. 10 indicates a seal pattern between the two substrates.

In this fourth embodiment, since the upper portions of the gate pad and the data pad have a transparent material such as indum-tin-oxide, the damage of the pad can be prevented.

It will be apparent to those skilled in the art that various modifications and variations can be made in the fabrication and application of the present invention without departing from the spirit or scope of the invention. Thus, it is intended that the present invention cover the modifications and variations of this invention provided they come within the scope of the appended claims and their equivalents.

What is claimed is:

1. A method of manufacturing an array substrate for a liquid crystal display device, the method comprising:
    forming a gate electrode, a gate line, and a gate pad on a substrate;
    forming a gate insulating layer on the gate electrode, the gate line, and the gate pad;
    forming an active layer on the gate insulating layer over the gate electrode;
    forming an ohmic contact layer on the active layer;
    forming source and drain electrodes, a data line and a data pad on the ohmic contact layer;
    forming a pixel electrode contacting the drain electrode;
    forming a gate pad terminal acting as an etching mask pattern directly on the gate insulating layer and having an opening such that a portion of the gate insulating layer corresponding to a central portion of the gate pad is exposed through the opening;
    forming a data pad terminal covering the data pad;
    forming a passivation layer on the pixel electrode, the gate pad terminal and the data pad terminal;
    exposing the gate pad terminal by etching the passivation layer;
    exposing the data pad terminal by etching the passivation layer; and
    exposing the gate pad by etching the exposed portion of the gate insulating layer using the gate pad terminal as the etching mask,
    wherein the step of forming the gate pad terminal and the data pad terminal is carried out simultaneously with the step of forming the pixel electrode using an exposing mask, and
    wherein other portions of the gate insulating layer covered with the gate pad terminal is not exposed to an etchant for etching the exposed portion of the gate insulating layer.

2. The method according to claim 1, wherein the step of forming the active layer and the step of forming source and drain electrodes, the data line and the data pad are processed through one photolithographic process.

3. The method according to claim 2, wherein the photolithographic process uses a diffraction exposure technique.

4. The method according to claim 1, wherein the gate insulating layer and the passivation layer contain silicon nitride or silicon oxide.

5. The method according to claim 4, wherein the etchant for etching the passivation layer includes hydrogen fluoride (HF).

6. The method according to claim 1, wherein in the exposing steps, the passivation layer in a portion of the gate pad and the passivation layer and the gate insulating layer uncovered by the mask pattern are completely removed to expose the gate pad.

* * * * *